US012690434B2

(12) United States Patent
Wang et al.

(10) Patent No.: US 12,690,434 B2
(45) Date of Patent: Jul. 21, 2026

(54) SURFACE DEPASSIVATION WITH THERMAL ETCH AFTER NITROGEN RADICAL TREATMENT

(71) Applicant: Applied Materials, Inc., Santa Clara, CA (US)

(72) Inventors: Dixiong Wang, Milpitas, CA (US); Xi Cen, San Jose, CA (US); Kai Wu, Palo Alto, CA (US); Peiqi Wang, Campbell, CA (US); Yang Li, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 918 days.

(21) Appl. No.: 18/054,798

(22) Filed: Nov. 11, 2022

(65) Prior Publication Data

US 2024/0162089 A1    May 16, 2024

(51) Int. Cl.
*H10W 20/00*        (2026.01)
(52) U.S. Cl.
CPC ....... *H10W 20/057* (2026.01); *H10W 20/045* (2026.01); *H10W 20/048* (2026.01); *H10W 20/056* (2026.01)
(58) Field of Classification Search
CPC ......... H01L 21/76879; H01L 21/76856; H01L 21/76865; H01L 21/76871–76876
See application file for complete search history.

(56) References Cited

U.S. PATENT DOCUMENTS

| | | | |
|---|---|---|---|
| 7,709,376 B2 * | 5/2010 | Matsuyama ...... | H01L 21/76843 257/E21.168 |
| 11,482,452 B2 * | 10/2022 | Yoon ................ | H01L 21/76877 |
| 12,176,203 B2 * | 12/2024 | Zhou .................. | C23C 16/4401 |
| 12,417,945 B2 * | 9/2025 | Chang ............... | H01L 21/76879 |
| 2010/0167527 A1 | 7/2010 | Wu et al. | |
| 2019/0080914 A1 | 3/2019 | Wang et al. | |
| 2020/0242209 A1 | 7/2020 | Bowes et al. | |
| 2021/0090948 A1 * | 3/2021 | Chen .................. | H01L 21/2254 |

FOREIGN PATENT DOCUMENTS

| | | |
|---|---|---|
| WO | 2018156710 A1 | 8/2018 |
| WO | 2021178593 A1 | 9/2021 |

OTHER PUBLICATIONS

International Search Report/ Written Opinion issued to PCT/US2023/079314 on Mar. 8, 2024.
Office Action from South Korean Patent Application No. 10-2025-7019243 dated Dec. 5, 2025.

* cited by examiner

*Primary Examiner* — Daniel Luke

(74) *Attorney, Agent, or Firm* — Patterson + Sheridan, LLP

(57)        ABSTRACT

A method of forming a structure on a substrate that includes forming a tungsten nucleation layer within at least one opening within a multi-tier portion of a substrate. The method includes exposing the nucleation layer to a nitrogen-containing gas to inhibit growth of the nucleation layer at narrow points within the at least one opening. The method includes exposing the at least one opening of the substrate to the tungsten-containing precursor gas to form a fill layer over the nucleation layer within the at least one opening. The method includes exposing the at least one opening to a molybdenum-containing gas to remove a tungsten nitride layer from the tungsten fill layer.

20 Claims, 11 Drawing Sheets

SURFACE DEPASSIVATION WITH THERMAL ETCH AFTER NITROGEN RADICAL TREATMENT

BACKGROUND

Field

Embodiments of the present invention generally relate to methods used in electronic device manufacturing, and more particularly, to methods used for forming tungsten features in a semiconductor device.

Description of the Related Art

Tungsten (W) is widely used in integrated circuit (IC) device manufacturing to form conductive features where relatively low electrical resistance and relativity high resistance to electromigration are desired. For example, tungsten may be used as a metal fill material to form source contacts, drain contacts, metal gate fill, gate contacts, interconnects (e.g., horizontal features formed in a surface of a dielectric material layer), and vias (e.g., vertical features formed through a dielectric material layer to connect other interconnect features disposed there above and there below).

Due to its relatively low resistivity, tungsten is also commonly used to form bit lines and word lines used to address individual memory cells in a memory cell array of a three-dimensional NAND (3D NAND) device. 3D NAND structures include tiers of horizontal arrays that can be stacked by depositing layers in sequence. Channels can be formed through the stack of films and filled with tungsten. In some cases, the channel sidewall widths can vary between tiers. During filling the channel, the tungsten fill layer can deposit an upper portion of the channel quicker than a lower portion due to the varying channel sidewall widths and higher concentration of precursor gases used to deposit the tungsten fill layer. This can cause void formation within portions of the channels, particularly for channels disposed in structures having two or more tiers, and particularly for high aspect ratio features.

Accordingly, there is a need for processes to fill contact features that are free or substantially free of voids and seams and have low resistivity for various film thicknesses within channels in multi-tier structures.

SUMMARY

Embodiments described herein generally relate to systems and methods used for forming tungsten features in a semiconductor device. More particularly, embodiments herein provide for processes and methods to depassivate a tungsten passivation layer to allow faster tungsten growth in a subsequent tungsten growth step.

In an embodiment, a method of forming a structure on a substrate is provided. In this embodiment, the method includes exposing at least one opening formed in a multi-tier portion of the substrate to a tungsten-containing gas at a precursor gas flow rate and exposing the at least one opening of the substrate to a reducing agent at a reducing agent flow rate. Here, the tungsten-containing gas and the reducing agent are alternated cyclically to form a nucleation layer within the at least one opening of the substrate. The method further includes exposing the at least one opening of the substrate to a nitrogen-containing gas to inhibit growth of the nucleation layer at narrow portions within the at least one opening, exposing the at least one opening to a molybdenum-containing gas to remove a desired amount of a tungsten nitride passivation layer from the nucleation layer, and exposing the at least one opening of the substrate to the tungsten-containing gas to form a fill layer over the nucleation layer within the at least one opening.

In another embodiment, a method of forming a structure on a substrate is provided. In this embodiment, the method includes exposing at least one opening formed within the substrate to a tungsten-containing precursor gas at a precursor gas flow rate. Here, the at least one opening comprises a lower portion and an upper portion, and the upper portion comprises a width smaller than a width of the lower portion. The method further includes exposing the at least one opening of the substrate to a reducing agent at a reducing agent flow rate. Here, the tungsten-containing precursor gas and the reducing agent are alternated cyclically to form a nucleation layer within the at least one opening of the substrate. The method also includes exposing the at least one opening of the substrate to the tungsten-containing precursor gas to form a portion of a fill layer over the nucleation layer within the at least one opening, exposing the at least one opening of the substrate to a nitrogen-containing species, exposing the at least one opening of the substrate to a molybdenum-containing gas to remove a tungsten nitride passivation layer from the fill layer on the at least one opening, and exposing the at least one opening of the substrate to the tungsten-containing precursor gas to form the fill layer within the at least one opening.

In yet another embodiment, a method of forming a structure on a substrate is provided. In this embodiment, the method includes forming a tungsten nucleation layer within at least one opening formed in a multi-tier portion of the substrate, exposing the tungsten nucleation layer to a nitrogen-containing plasma to inhibit growth of the tungsten nucleation layer at narrow portions within the at least one opening, exposing the at least one opening to a tungsten-containing precursor gas to form a fill layer over the nucleation layer within the at least one opening, exposing the at least one opening of the substrate to a nitrogen-containing gas to inhibit growth of portions of the fill layer along the at least one opening, and exposing the at least one opening to a molybdenum-containing gas to remove a tungsten nitride passivation layer from the fill layer on the at least one opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

FIG. 2 is a schematic view of a processing system that may be used to implement the methods set forth herein, according to one embodiment.

FIG. 3 is a diagram illustrating simplified process flows used to process a substrate, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are generally directed to electronic device manufacturing and, more particularly, to systems and methods for forming low resistivity tungsten features in a semiconductor device manufacturing scheme.

Figure 1:
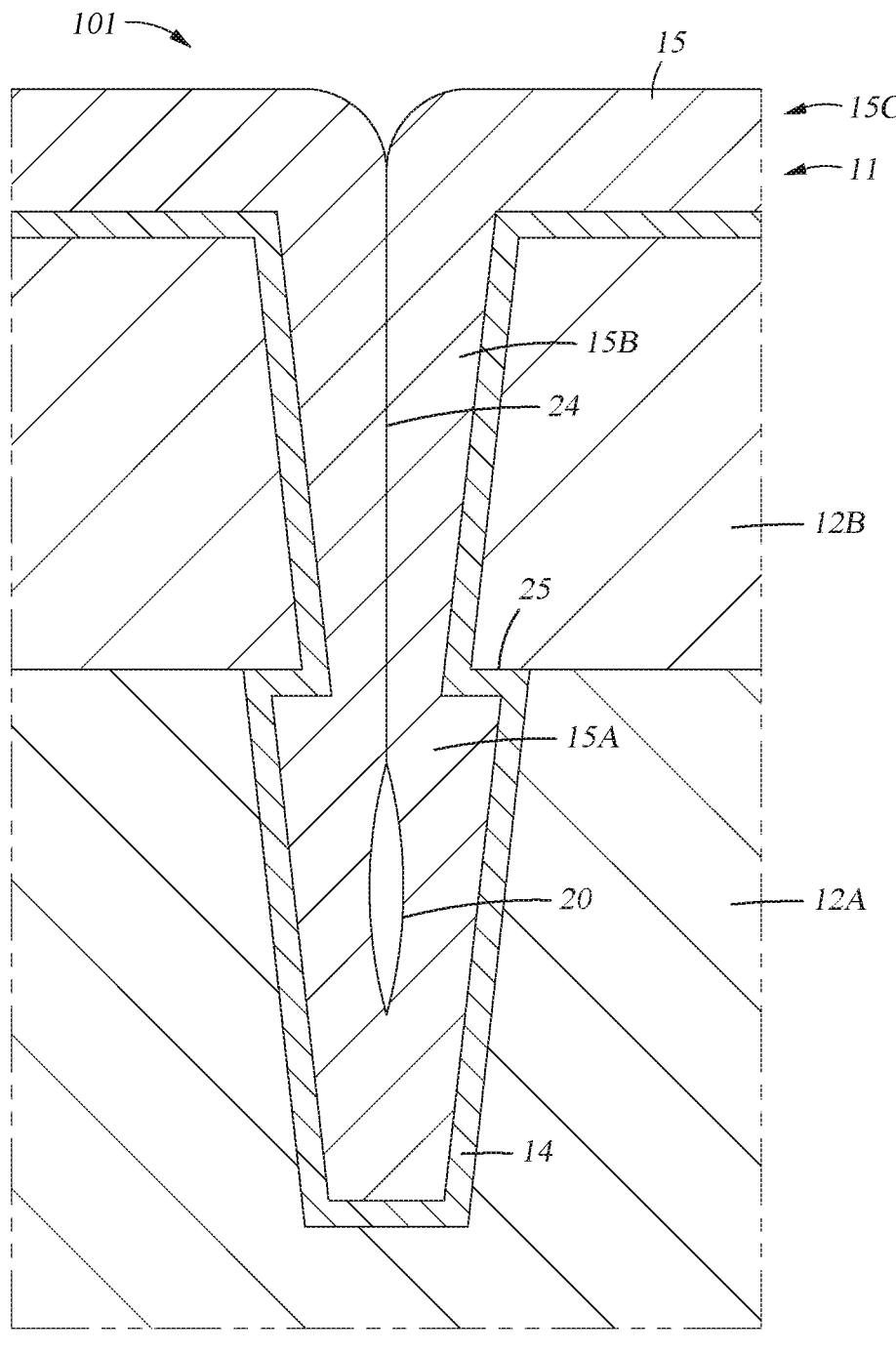
FIG. 1 is a schematic section view of a portion of a substrate illustrating undesirable voiding or seaming in conventionally formed tungsten features.

FIG. 1 is a schematic cross-sectional view of a substrate 101 illustrating an undesirable void 20 formed during a conventional tungsten deposition process. Here, the substrate 101 includes a patterned surface 11 disposed within a plurality of tier layers, such as a first tier layer 12A and a second tier layer 12B. In some embodiments, the first tier layer 12A is a first dielectric layer (e.g., silicon oxide ($SiO_x$)) and the second tier layer 12B is a second dielectric layer (e.g., silicon nitride (SiN)). In some embodiments, the substrate 101 includes a plurality of alternating first and second tier layers. The patterned surface 11 includes at least one opening having a high aspect ratio opening formed therein (shown filled with a portion of a tungsten layer 15), a barrier material layer 14 deposited on the tier layers 12A, 12B to line the opening, and the tungsten layer 15 deposited on the barrier material layer 14. The tungsten layer 15 illustrated in FIG. 1 is formed using a conventional deposition process, e.g., a chemical vapor deposition (CVD) or atomic layer deposition (ALD) process where tungsten is conformally deposited (grown) on the patterned surface 11 to fill the opening. The tungsten layer 15 forms a tungsten feature 15A within the first tier layer 12A, a tungsten feature 15B within the second tier layer 12B and an overburden of material (tungsten overburden layer 15C) on the field of the patterned surface 11.

In FIG. 1, the opening has a non-uniform profile that is wider at the surface of the substrate 101 and tapers as the opening extends from the surface inwardly into the second layer 12B. At an interface 25 of the first and second tier layers, the width of the second tier layer 12B is narrower than the width of the first tier layer 12A disposed inward from the second tier layer 12B. As shown, interface portions of the conformal tungsten layer 15 have grown together to block or "pinch off" the entrance to the opening disposed in the first tier 12A before the opening could be completely filled, thus causing the undesirable void 20, i.e., an absence of tungsten material, in the tungsten feature 15A. In addition to voids, undesirable seams (e.g., 24) can occur in tungsten features, as shown within the second tier 12B using a conventional tungsten deposition process. The void 20 and seam 24 are vulnerable to corrosion from the chemically active components of tungsten chemical mechanical polishing (CMP) polishing fluid, which may cause undesirable loss of tungsten material from the feature 15A, 15B if the seam 24 or void 20 is exposed during the CMP process.

Accordingly, embodiments herein provide a processing system that is configured to perform a combination of the individual aspects of the methods without transferring a substrate between processing chambers, thus improving overall substrate processing throughput and capacity for the tungsten gapfill processing schemes described herein. The methods and systems provided herein are particularly useful for tungsten gapfill for high aspect ratio features, such as about 25:1 or greater, such as about 30:1 to about 100:1, such as about 50:1 to about 80:1. The aspect ratio refers to a ratio of total height to an average width or diameter of the feature.

Generally, the gapfill processing schemes described herein include forming a differential tungsten deposition inhibition profile in feature openings formed in a surface of a substrate, filling the openings with tungsten material according to the inhibition profile, and depositing an overburden of tungsten on the field surface of the substrate. Forming the tungsten deposition inhibition profile typically includes forming a tungsten nucleation layer and treating the tungsten nucleation layer using a nitrogen-containing gas, an activated nitrogen species, e.g., treatment radicals, or a combination thereof. The nitrogen-containing gas can further include molecules including hydrogen atoms, fluorine atoms, or combinations thereof, such as nitrogen trifluoride, $NH_3$, $N_2H_4$, or combinations thereof. The nitrogen from the nitrogen-containing gas, the activated nitrogen species, or a combination thereof are incorporated into portions of the nucleation layer, e.g., by adsorption of the nitrogen or by reaction with the metallic tungsten of the nucleation layer to form a tungsten nitride (WN) passivation layer. The adsorbed nitrogen or nitrided surface of the tungsten nucleation layer desirably delays (inhibits) tungsten nucleation and thus subsequent tungsten deposition thereon.

The WN passivation layer, while desirably inhibiting tungsten nucleation, may increase tungsten bulk film stress and increase the processing time to allow for the WN layer to depassivate before a subsequent tungsten fill layer may be effectively deposited thereon. Subsequent to forming the WN passivation layer, a soak of molybdenum halide or oxyhalide such as molybdenum hexafluoride ($MoF_6$) may be used to etch the WN passivation layer after treatment with a non-plasma activated nitrogen containing gas, nitrogen radicals, or a combination therefrom. The molybdenum halide soak reacts with the WN passivation layer such that the molybdenum halide soak reduces the WN passivation layer and produces an $NF_x$ gas which is evacuated by normal means. After etching the WN passivation layer, the tungsten nucleate is re-exposed and another tungsten layer may be immediately deposited.

Further, it has been shown that the molybdenum halide soak also reduces the bulk film stress. A molybdenum halide soak of greater than 2 seconds can recover the stress penalty cause by the WN passivation layer formation in the film, especially at tungsten bulk thicknesses of greater than 2,500 Å. The molybdenum halide soak also reduces the depassivation time required after exposing the nucleation layer or tungsten fill layer to the non-plasma activated nitrogen-containing gas and nitrogen radicals and allows tungsten growth to resume sooner. Further, the molybdenum halide soak may be done in cycles as desired. For example, the molybdenum halide soak may be done after each tier is treated.

It has also been shown that the etch rate of the molybdenum halide soak is proportional to the flow rate of the molybdenum halide soak into the chamber, the temperature of the heater, and pressure of the chamber. For example, a flow rate of 80 sccm produces an etch rate of 6 Å per second at 400° C. and 5 Torr. As such, an incubation of 10N10 can be removed after 5 seconds of the molybdenum halide soak at this example etch rate. The flow rate of the molybdenum halide soak may be adjusted to produce a desired soak etch rate at a given heater temperature and chamber pressure.

In some embodiments, the treatment radicals are formed remotely from a substrate processing chamber by use of a remote plasma source fluidly coupled thereto. The desired inhibition effect on the field of the patterned surface and the desired inhibition profile in the openings formed in the patterned surface is achieved by controlling processing conditions within the processing chamber, such as temperature and pressure, and controlling the concentration, flux, and energy of the treatment radicals at the substrate surface. Typically, the treatment radicals are formed from a non-halogen nitrogen-containing gas, such as $N_2$, $NH_3$, $NH_4$, or combinations thereof. In some embodiments, the nitrogen-containing gas is provided to the process chamber without transferring the substrate. Without being bound by theory, it is believed that the nitrogen-containing gas, such as nitrogen trifluoride, hydrozine, ammonia, or a derivative thereof inhibits growth within the openings at interfaces of tier layers in order to adequate fill a bottom of the openings and prevent pinch off at the interfaces. It has been discovered that treatments that include radicals can provide enhanced inhibition closer to a surface of the opening, whereas the non-plasma activated nitrogen (e.g., thermally activated nitrogen) from the nitrogen-containing gas enables inhibition at locations deeper within the openings. Similarly, during exposure to a molybdenum-containing gas such as a molybdenum halide, the etch rate and depth is proportional to the flow rate of the molybdenum halide. Thus, a higher flow rate of the molybdenum halide into the processing chamber etches deeper into the WN passivation layer faster. Therefore, in some embodiments, by performing a process that combines the exposure of a portion of a nucleation layer, a portion of a tungsten fill layer, or a combination thereof, during their respective process operations, to nitrogen-containing molecules and also to nitrogen radicals, the formation of voids can be prevented from forming during a fill process. The process can include adjusting the relative amount of exposure to the non-plasma activated nitrogen-containing gas and also to nitrogen radicals during the deposition process and subsequently etching the WN passivation layer using the molybdenum halide. Adjusting the relative amount of exposure to the nitrogen-containing gas and also to nitrogen radicals during a cyclic deposition process, which is used to form either the nucleation layer or the tungsten fill layer, and etching away the passivation layer allows a desired deposition profile to be created in the feature during the deposition process.

The exposure to the non-plasma activated nitrogen-containing gas and also to nitrogen radicals during the cyclic deposition process can be completed simultaneously or sequentially. In one example, the deposition layer is sequentially exposed to the non-plasma activated nitrogen-containing gas first and then to nitrogen radicals before a subsequent layer of the nucleation layer or the fill layer is deposited thereon. In another example, the deposition layer is sequentially exposed to the nitrogen radicals first and then to the non-plasma activated nitrogen-containing gas before a subsequent layer of the nucleation layer or the fill layer is deposited thereon.

The tungsten nucleation and deposition processes of the gapfill processing scheme generally include flowing a tungsten-containing precursor and a reducing agent into the processing chamber and exposing the substrate surface thereto. The tungsten-containing precursor and the reducing agent react on the surface of the substrate in one of a chemical vapor deposition (CVD) process, a pulsed CVD process, an atomic layer deposition (ALD) process, or a combination thereof to deposit tungsten material thereon.

Figure 2:
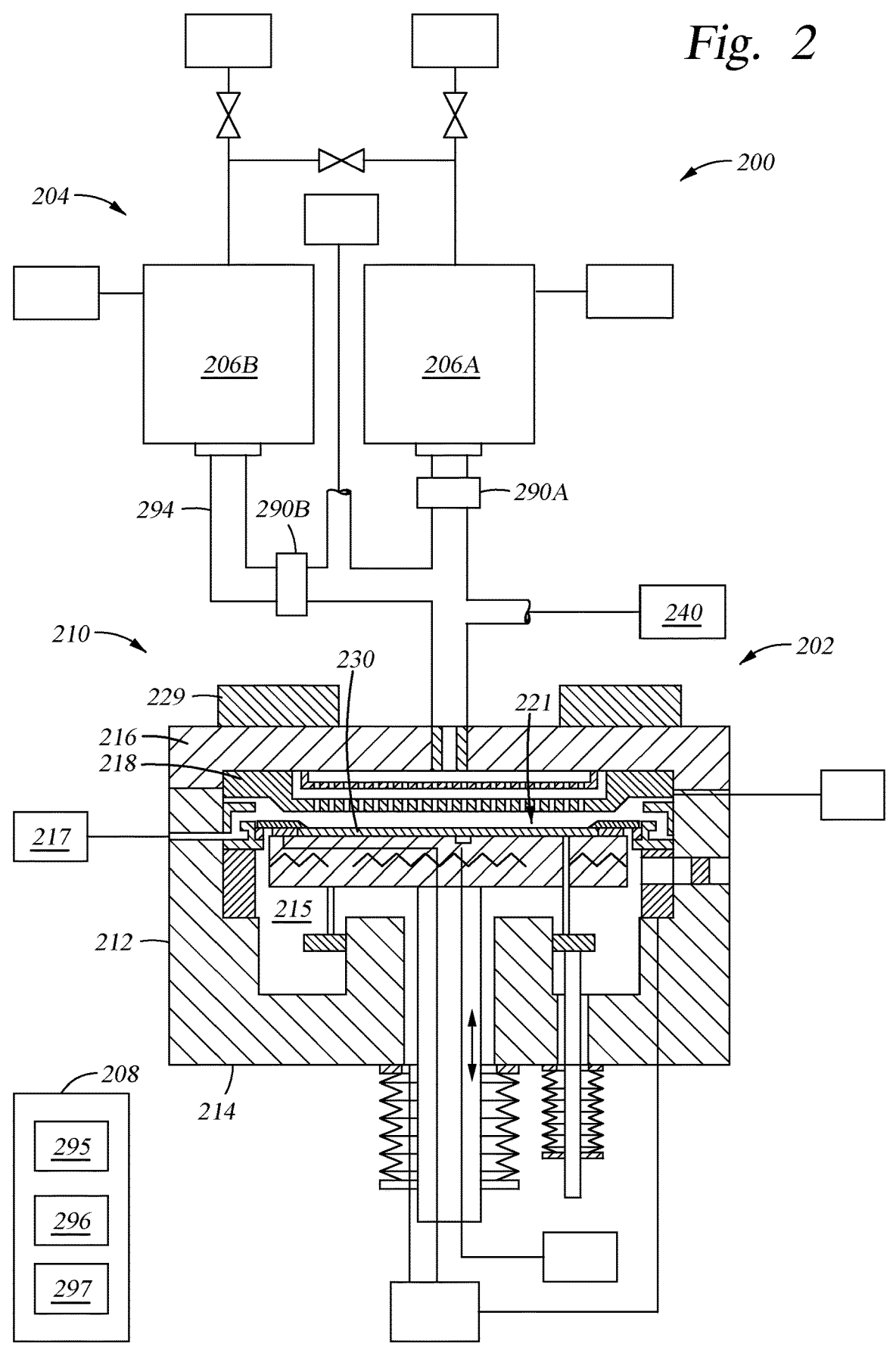

FIG. 2 schematically illustrate a processing system 200 that may be used to perform the bottom-up tungsten gapfill substrate processing methods described herein. Here, the processing system 200 is configured to provide the different processing conditions desired for each of a nucleation process, inhibition treatment process, soak etch process, selective gapfill process, and overburden deposition process within a single processing chamber 202, i.e., without transferring a substrate between a plurality of processing chambers.

As shown in FIG. 2, the processing system 200 includes a processing chamber 202, a gas delivery system 204 fluidly coupled to the processing chamber 202, and a system controller 208. The processing chamber 202 includes a chamber lid assembly 210, one or more sidewalls 212, and a chamber base 214, which collectively define a processing volume 215. The processing volume 215 is fluidly coupled to an exhaust 217, such as one or more vacuum pumps, used to maintain the processing volume 215 at sub-atmospheric conditions and to evacuate processing gases and processing by-products therefrom.

The processing system 200 is advantageously configured to perform each of the tungsten nucleation, inhibition treatment, and bulk tungsten deposition processes of a void-free and seam-free tungsten gapfill process scheme without removing the substrate 230 from the processing chamber 202. The gases used to perform the individual processes of the gapfill process scheme, and to clean residues from the interior surfaces of the processing chamber, are delivered to the processing chamber 202 using the gas delivery system 204 fluidly coupled thereto.

Generally, the gas delivery system 204 includes one or more remote plasma sources, here the first and second radical generator 206A-B, a deposition gas source 240, and a conduit system 294 (e.g., the plurality of conduits 294A-F) fluidly coupling the radical generators 206A-B and the deposition gas source 240 to the lid assembly 210. Although the gas delivery system 204 shown includes two radical generators 206A-B, the processes describe herein could also be practiced using a gas delivery system 204 having only a single radical generator 206A. The gas delivery system 204 further includes a plurality of isolation valves, here the first and second valves 290A-B, respectively disposed between the radical generators 206A-B and the lid plate 216, which may be used to fluidly isolate each of the radical generators 206A-B from the processing chamber 202 and from one another.

As shown, the first radical generator 206A is fluidly coupled to the processing chamber 202 by use of first and second conduits 294A-B, which extend upwardly from the gas inlet 223 to connect with an outlet of the first plasma chamber volume 281A. A first valve 290A, disposed between the first and second conduits 294A-B, is used to selectively fluidly isolate the first radical generator 206A from the processing chamber 202 and the other portions of the gas delivery system 204. Typically, the first valve 290A is closed during the chamber clean process to prevent activated cleaning gases, e.g., halogen radicals, from flowing into the first plasma chamber volume 281A and damaging the surfaces thereof.

The second radical generator 206B is fluidly coupled to the second conduit 294B, and thus the processing chamber 202, by use of third and fourth conduits 294C-D. The second radical generator 206B is selectively isolated from the processing chamber 202 and from the other portions of the gas delivery system 204 by use of a second valve 290B that is disposed between the third and fourth conduits 294C-D.

Deposition gases, e.g., tungsten-containing precursors and reducing agents, are delivered from the deposition gas source 240 to the processing chamber 202 using a fifth conduit 294E. As shown, the fifth conduit 294E is coupled to the second conduit 294B at a location proximate to the gas inlet 223 so that the first and second valves 290A-B may be used to respectively isolate the first and second radical generators 206A-B from deposition gases introduced into the processing chamber 202. In some embodiments, the gas delivery system 204 further includes a sixth conduit 294F which is coupled to the fourth conduit 294D at a location proximate to the second valve 290B. The sixth conduit 294F, is fluidly coupled to a bypass gas source 238, e.g., an argon (Ar) gas source, which may be used to periodically purge portions of the gas delivery system 204 of undesired residual cleaning, inhibition, and deposition gases.

Operation of the processing system 200 is facilitated by the system controller 208. The system controller 208 includes a programmable central processing unit, here the CPU 295, which is operable with a memory 296 (e.g., non-volatile memory) and support circuits 297. The CPU 295 is one of any form of general-purpose computer processor used in an industrial setting, such as a programmable logic controller (PLC), for controlling various chamber components and sub-processors. The memory 296, coupled to the CPU 295, facilitates the operation of the processing chamber. The support circuits 297 are conventionally coupled to the CPU 295 and comprise cache, clock circuits, input/output subsystems, power supplies, and the like, and combinations thereof coupled to the various components of the processing system 200 to facilitate control of substrate processing operations therewith.

The instructions in memory 296 are in the form of a program product, such as a program that implements the methods of the present disclosure. In one example, the disclosure may be implemented as a program product stored on computer-readable storage media for use with a computer system. The program(s) of the program product define functions of the embodiments (including the methods described herein). Thus, the computer-readable storage media, when carrying computer-readable instructions that direct the functions of the methods described herein, are embodiments of the present disclosure.

The processing system 200 described above may be used to perform each of the nucleation, inhibition, gapfill deposition, thus providing a single-chamber seam-free tungsten gapfill solution.

Figure 3:
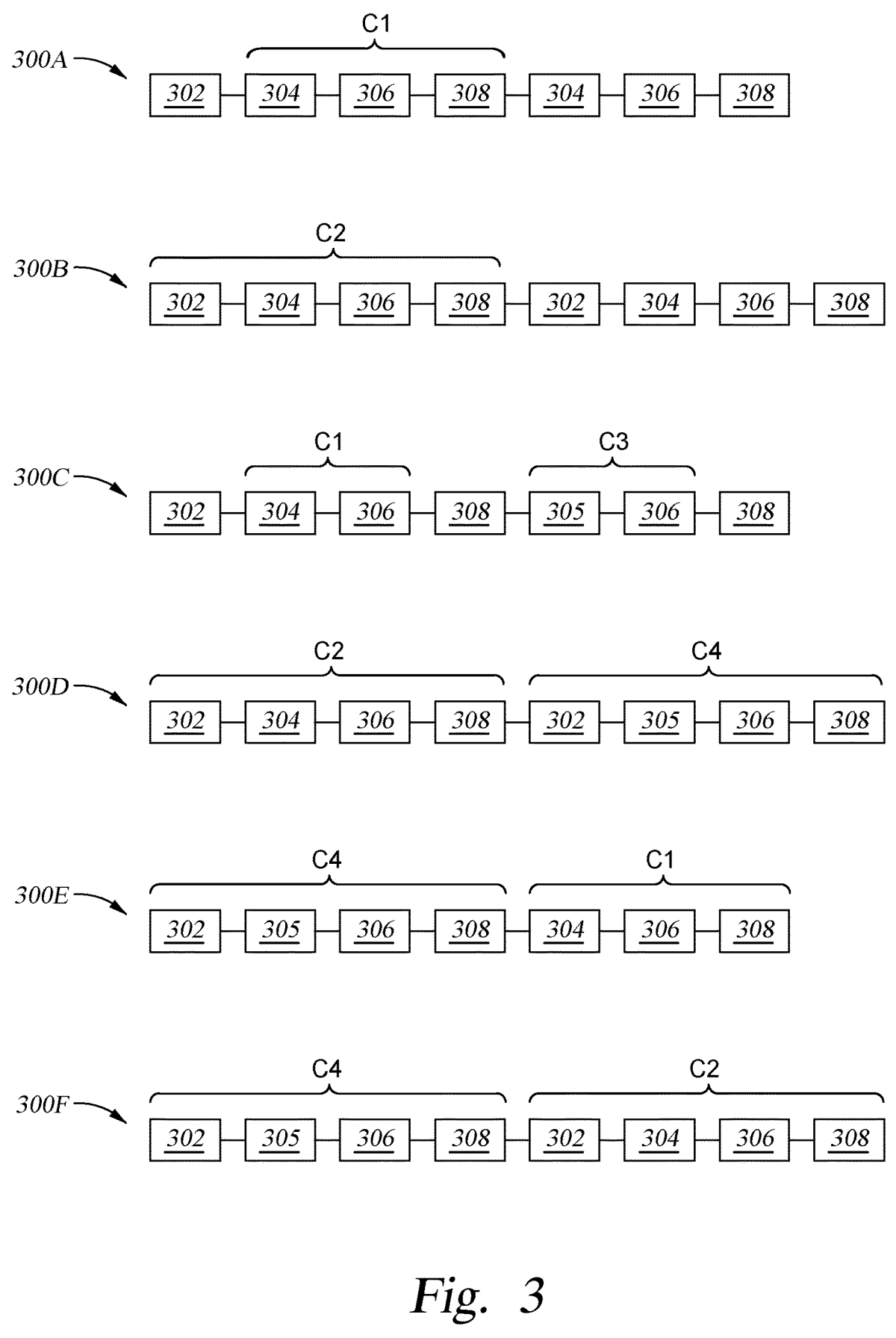
Figure 4A:
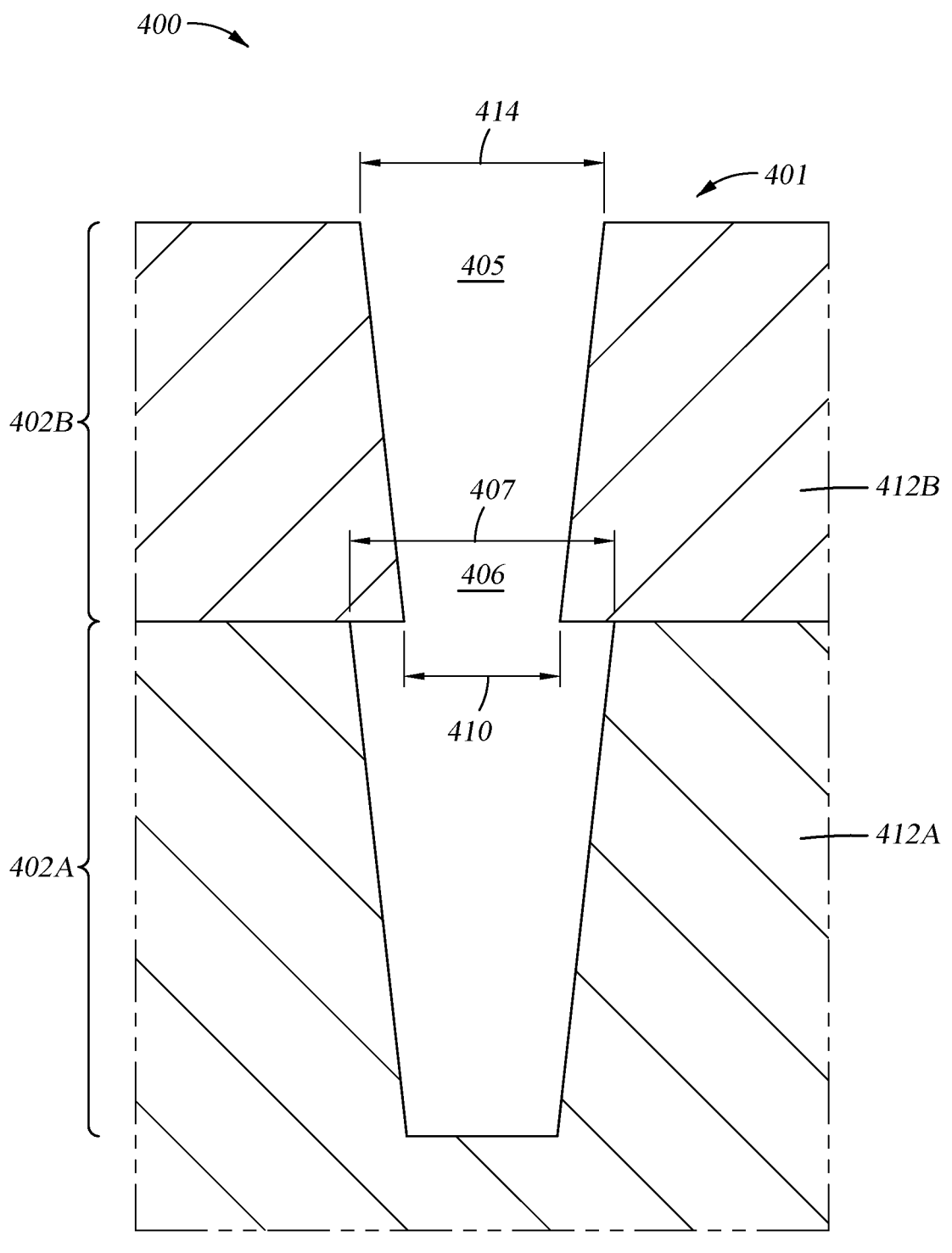
FIG. 4A is a schematic sectional view of a portion of a substrate including a substrate to be processed by a method described herein, according to one embodiment.
Figure 4B:
FIG. 4B is a schematic sectional view of a portion of a substrate including a substrate processed by a method described herein, according to one embodiment.

FIG. 3 is a diagram illustrating simplified process flows used to process a substrate according to some embodiments, which may be performed using the processing system 200. FIGS. 4A-4B are schematic sectional views of a portion of a substrate 400 illustrating aspects at different stages of a void-free and seam-free tungsten gapfill process scheme.

The substrate 400 features a patterned surface 401 including a first tier layer 412A and a second tier layer 412B having a plurality of openings 405 (one shown) formed therein. In some embodiments, the plurality of openings 405 include one or a combination of high aspect ratio via or trench openings having a width (e.g., each of 407, 414) of about 100 nm to about 400 nm, such as about 200 nm to about 300 nm and a depth (e.g., each of 402A or 402B or either of 402A or 402B) of about 2 μm to about 8 μm, such as about 3 μm to about 6 μm. In some embodiments, the plurality of openings includes at least one opening with a width 410 of a narrowest portion of the opening of about 50 nm to about 200 nm, such as about 75 nm to about 125 nm. In some embodiments, individual openings 405 may have an aspect ratio (depth to width ratio) of about 10:1 or more, such as about 25:1 or more, such as about 30:1 to about 100:1, such as about 40:1 to about 60:1. In some embodiments, the vias or trench openings include aspect ratios of about 20:1 to about 40:1. An opening disposed within the first tier 412A is referred to as first tier opening 402A and an opening disposed within the second tier 412B is referred to as a second tier opening 402B. The first and second tier openings together form a single contiguous opening 405. The uppermost portion of the first tier opening 402A interfaces the lowermost portion of the second tier opening 402B at interface 406.

The width 407 of the uppermost portion of the first tier opening is greater than a width 410 of the lowermost portion of the second tier opening 402B at the interface. In some embodiments, the width 407 is about 5% to about 100% greater than the width 410, such as about 10% greater to about 50% greater. For example, width 410 can be about 50 nm to about 300 nm, such as about 75 nm to about 125 nm and the width of 407 can be about 70 nm to about 400 nm, such as about 150 nm to about 250 nm. In some embodiments, for each tier, a widest portion of the tier, such as the uppermost portion 414 of the second tier 402B is about 5% to about 100% greater than a narrowest portion of the tier, such as a lowermost portion 410 of the second tier 402B, such as about 10% greater to about 50% greater. In some embodiments, a height of the first tier opening 402A is substantially the same, is less than, or greater than a height of the second tier opening 402B. Without being bound by theory, it is believed that sudden differences in opening widths at interfaces can cause a pinching effect. The methods described herein enables a growth behavior that fills openings without the formation of voids.

As shown in FIG. 4B, the patterned surface 401 includes a barrier or adhesion layer 403, e.g., a titanium nitride (TiN) layer, deposited on the first tier layer 412A and the second tier layer 412B to conformally line the opening 405 and facilitate the subsequent deposition of a tungsten nucleation layer 404. In some embodiments, the adhesion layer 403 is deposited to a thickness of between about 20 angstroms (Å) and about 150 Å, such as about 30 Å to about 100 Å.

Nucleation Layer Deposition

Each of the process flows 300A, 300B, 300C, 300D, 300E, and 300F include forming a nucleation layer 404 over the substrate 400 depicted as activity 302. The nucleation layer can be formed using any process capable of forming a tungsten nucleation layer. In some embodiments, prior to forming the nucleation layer 404, the substrate is exposed in a boron-containing gas, such as $B_2H_6$, such as for a soak time of about 5 seconds or greater, such as about 10 seconds or greater, such as about 20 seconds to 30 seconds. In some embodiments, the nucleation layer 404 is deposited over adhesion layer 403.

The nucleation layer can be formed using atomic layer deposition (ALD) of a tungsten-containing nucleation layer, or a physical vapor deposition (PVD) process. Forming the nucleation layer includes exposing the substrate 400 to a tungsten-containing precursor gas at a first precursor gas flow rate. In some embodiments, forming the nucleation layer includes exposing the substrate to a reducing agent. The reducing agent includes boron and is introduced to the process chamber at a reducing agent flow rate. In some embodiments, the tungsten-containing precursor gas and the reducing agent are alternated cyclically to form a nucleation layer over the substrate within at least one opening of the substrate at the reducing agent flow rate. In some embodiments, the reducing agent and the tungsten-containing precursor gas are cyclically alternated, beginning with either the reducing agent or the tungsten-containing precursor gas, and ending with the same beginning gas or ending with a gas different from the beginning gas. In some embodiments, the reducing agent or the tungsten-containing precursor gas are cyclically alternated beginning with tungsten-containing precursor gas and ending in the reducing agent. A portion of an exemplary substrate 400 having the nucleation layer 404 formed thereon is schematically illustrated in FIG. 4B.

In some embodiments, the nucleation layer 404 is deposited using an atomic layer deposition (ALD) process. The ALD process includes repeating cycles of alternately exposing the substrate 400 to a tungsten-containing precursor and exposing the substrate 400 to a reducing agent. In some embodiments, the processing region 221 is purged between the alternating exposures. In some embodiments, the process region 221 is continuously purged. Examples of suitable tungsten-containing precursors include tungsten halides, such as tungsten hexafluoride ($WF_6$), tungsten hexachloride ($WCl_6$), or combinations thereof. In some embodiments, the tungsten-containing precursor includes $WF_6$, and the reducing agent includes a boron-containing agent, such as $B_2H_6$. In some embodiments, the tungsten-containing precursor comprises an organometallic precursor or a fluorine-free precursor, e.g., MDNOW (methylcyclopentadienyl-dicarbonylnitrosyl-tungsten), EDNOW (ethylcyclopentadienyl-dicarbonylnitrosyl-tungsten), tungsten hexacarbonyl (W(CO)$_6$), or combinations thereof.

During the nucleation process, the processing volume 215 is maintained at a pressure of less than about 120 Torr, such as of between about 900 mTorr and about 120 Torr, between about 1 Torr and about 100 Torr, or for example, between about 1 Torr and about 50 Torr. Exposing the substrate 400 to the tungsten-containing precursor includes flowing the tungsten-containing precursor into the processing region 221 from the deposition gas source 240 at a flow rate of about 100 sccm or less, such as about 10 sccm to about 60 sccm, or about 20 sccm to about 80 sccm. Exposing the substrate 400 to the reducing agent includes flowing the reducing agent into the processing region 221 from the deposition gas source 240 at a flow rate of about 200 sccm to about 1000 sccm, such as between about 300 sccm and about 750 sccm.

It should be noted that the flow rates for the various deposition and treatment processes described herein are for a processing system 200 configured to process a 300 mm diameter substrate. Appropriate scaling may be used for processing systems configured to process different-sized substrates.

The tungsten-containing precursor and the reducing agent are each flowed into the processing region 221 for a duration of between about 0.1 seconds and about 10 seconds, such as between about 0.5 seconds and about 5 seconds. The processing region 221 may be purged between the alternating exposures by flowing a purge gas, such as argon (Ar) or hydrogen gas, into the processing region 221 for a duration of between about 0.1 seconds and about 10 seconds, such as between about 0.5 seconds and about 5 seconds. The purge gas may be delivered from the deposition gas source 240 or from the bypass gas source 238. Typically, repeating cycles of the nucleation process continues until the nucleation layer 404 has a thickness of between about 10 Å and about 200 Å, such as between about 10 Å and about 150 Å, or between about 20 Å and about 150 Å. The nucleation layer 404 is disposed along sidewalls of the opening 405, such as over the barrier or adhesion layer 403.

In some embodiments, immediately following each nucleation activity 302, a tungsten gapfill material 408 (FIG. 4B) is optionally deposited, at least partially, into the plurality of openings 405, in activity 306. A need for the optional activity 306 immediately following the nucleation activity 302 is determined based on a profile of the opening, such as relative heights of the tiers. By way of example, for lower tiers that are much longer than upper tiers, the interface between the tiers, referred to herein as a "necking point," can be disposed proximate to a surface of the opening, thus the opening can be at least partially filled with the tungsten gapfill material 408 prior to introducing growth inhibitors. In some embodiments, the optional operation 306 is performed when the minimum width of the opening is within about 50% or less of the maximum width of the opening, such as within 30% or less, such as within 20% or less. Other profiles can determine a need for optional activity 306, such as lower aspect ratio features can benefit from the optional operation, and features with a wide opening at the surface. Without being bound by theory, it is believed that optional activity 306 enables enhanced throughput prior to the inhibition operation.

In one embodiment, the tungsten gapfill material 408 is formed using a chemical vapor deposition (CVD) process comprising concurrently flowing (co-flowing) a tungsten-containing precursor gas, and a reducing agent into the processing region 221 and exposing the substrate 400 thereto. The tungsten-containing precursor and the reducing agent used for the tungsten gapfill CVD process may comprise any combination of the tungsten-containing precursors and reducing agents described with reference to activity 302. In some embodiments, the tungsten-containing precursor comprises $WF_6$, and the reducing agent includes hydrogen gas. In some embodiments, the tungsten gapfill material 408 partially fills the plurality of openings 405.

The tungsten-containing precursor is flowed into the processing region 221 at a rate of between about 10 sccm and about 1200 sccm, or more than about 50 sccm, or less than about 1000 sccm, or between about 100 sccm and about 900 sccm. The reducing agent is flowed into the processing region 221 at a rate of more than about 500 sccm, such as more than about 750 sccm, more than about 1000 sccm, or between about 500 sccm and about 10000 sccm, such as between about 1000 sccm and about 9000 sccm, or between about 1000 sccm and about 8000 sccm.

In some embodiments, the tungsten gapfill CVD process conditions are selected to provide a tungsten feature having a relativity low residual film stress when compared to conventional tungsten CVD processes. For example, in some embodiments, the tungsten gapfill CVD process includes heating the substrate to a temperature of about 250° C. or more, such as about 300° C. or more, or between about 250° C. and about 600° C., or between about 300° C. and about 500° C. During the CVD process, the processing volume 215 is typically maintained at a pressure of less than about 500 Torr, less than about 600 Torr, less than about 500 Torr, less than about 400 Torr, or between about 1 Torr and about 500 Torr, such as between about 1 Torr and about 450 Torr, or between about 1 Torr and about 400 Torr, or for example, between about 1 Torr and about 300 Torr.

In another embodiment, the tungsten gapfill material 408 is deposited at operation 306 using an atomic layer deposition (ALD) process. The tungsten gapfill ALD process includes repeating cycles of alternately exposing the substrate 400 to a tungsten-containing precursor gas and a reducing agent and purging the processing region 221 between the alternating exposures.

The tungsten-containing precursor and the reducing agent are each flowed into the processing region 221 for a duration of between about 0.1 seconds and about 10 seconds, such as between about 0.5 seconds and about 5 seconds. The processing region 221 is typically purged between the alternating exposures by flowing an inert purge gas, such as argon (Ar) or hydrogen, into the processing region 221 for a duration of between about 0.1 seconds and about 10 seconds, such as between about 0.5 seconds and about 5 seconds. The purge gas may be delivered from the deposition gas source 240 or from the bypass gas source 238.

In other embodiments, the tungsten gapfill material 408 is deposited using a pulsed CVD method that includes repeating cycles of alternately exposing the substrate 400 to a tungsten-containing precursor gas and a reducing agent without purging the processing region 221. The processing conditions for the tungsten gapfill pulsed CVD method may be the same, substantially the same, or within the same ranges as those described above for the tungsten gapfill ALD process.

In some embodiments, the nucleation layer 404 and the fill layer 408 are monolithic and do not have an interface therebetween. The tungsten gapfill material 408 and the nucleation layer 404 together form a tungsten-containing layer. The thickness of the tungsten-containing layer is measured from an interface between the adhesive layer and the nucleation layer to a center of the fill layer 408.

After forming the nucleation layer 404 and optional tungsten gap fill material 408, a differential inhibition profile is formed by exposing the sidewalls of the openings to a nitrogen-containing gas (e.g., $NF_3$, $NH_3$, or $N_2H_4$), an activated species of a treatment gas, such as a nitrogen-containing treatment gas, or combinations thereof. Several combinations of processes is described with reference to process 300A, 300B, 300C, 300D, 300E, and 300F. Other combinations are also contemplated.

Process 300A—Nitrogen-Containing Gas Treatment

As shown in FIG. 3, process 300A includes in activity 304, after forming the nucleation layer 404 (e.g., described in activity 302), treating the nucleation layer 404 or an outer surface of the tungsten gapfill material 408 (e.g., after optional activity 306) to inhibit tungsten deposition on a field surface of the substrate 400 at interfaces between adjacent tiers (e.g., necking points). Activity 304 forms a differential inhibition profile in the plurality of openings 405 by use of a differential inhibition process. Forming the differential inhibition profile includes exposing the sidewalls of the openings to a non-plasma activated nitrogen-containing gas (e.g., $NF_3$, $NH_3$, or $N_2H_4$).

Exposing the openings to the non-plasma activated nitrogen-containing gas includes flowing the nitrogen-containing gas for about 1 second to about 90 seconds, such as about 1 second to about 30 seconds, such as about 3 seconds to about 20 seconds, such as about 7 seconds to about 15 seconds. In some embodiments, the temperature of the substrate is maintained at about 200° C. to about 600° C., such as about 300° C. to about 500° C., such as about 400° C. to about 450° C. In some embodiments, nitrogen-containing gas is flowed at a rate of about 0.5 sccm to about 1000 sccm, such as about 100 sccm to about 500 sccm, such as about 300 sccm to about 500 sccm, or about 600 sccm to about 800 sccm. In some embodiments, a thickness of the tungsten layer within the opening before the non-plasma activated nitrogen-containing gas is introduced to the opening is less than or equal to the thickness of the tungsten layer within the opening after the non-plasma activated nitrogen-containing gas is introduced. In some embodiments, the nitrogen-containing gas is combined with an inert carrier gas, such as Ar, He, or a combination thereof, to form a nitrogen-containing mixture. In some embodiments, a volumetric gas flow ratio of nitrogen-containing gas to inert carrier gas is about 1:10,000 to about 1:10, such as about 1:5 to about 1:2, or about 1:4 to about 1:1, such as about 1:3 to about 1:2.

After the treatment described in activity 304, a tungsten gap fill material 408 is formed in the opening at activity 306. After the tungsten gap fill described in activity 306, the tungsten gap fill material is exposed to a molybdenum halide soak 418 in activity 308, to remove a tungsten nitride (WN) passivation layer 416 formed as part of activity 304 as shown in FIGS. 4C-4J. The molybdenum halide soak 418 may include a molybdenum hexafluoride soak or a molybdenum oxyhalide soak. Exposing the openings 405, 406 to the molybdenum halide soak 418 includes flowing the molybdenum halide soak 418 for about 1 second to about 90 seconds, such as about 1 second to about 30 seconds, such as about 3 seconds to about 20 seconds, such as about 5 seconds to about 15 seconds. In some embodiments, the molybdenum halide soak 418 is flowed at a rate of about 0.5 sccm to about 1000 sccm, such as about 80 sccm, or other appropriate flow rate to achieve a desired etch rate. The molybdenum halide soak 418 removes the WN passivation layer 416 to recover incubation prior to the deposition of a subsequent tungsten nucleation layer 404 or a tungsten gap fill layer 408.

Figure 4C:
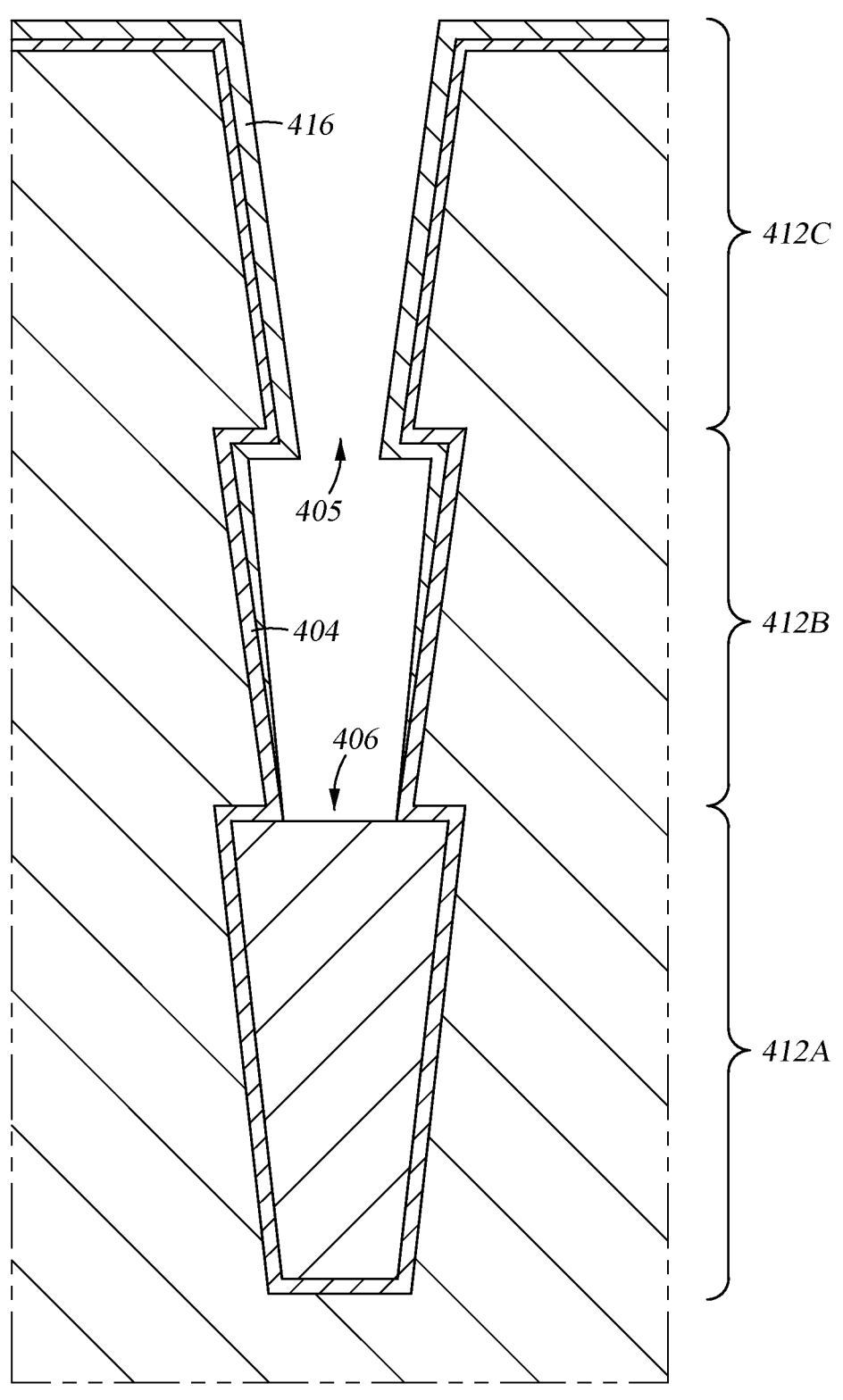
FIGS. 4C-4E are a schematic sectional view of a soak activity on a portion of a substrate as part of a method described herein, according to one embodiment.
Figure 4D:
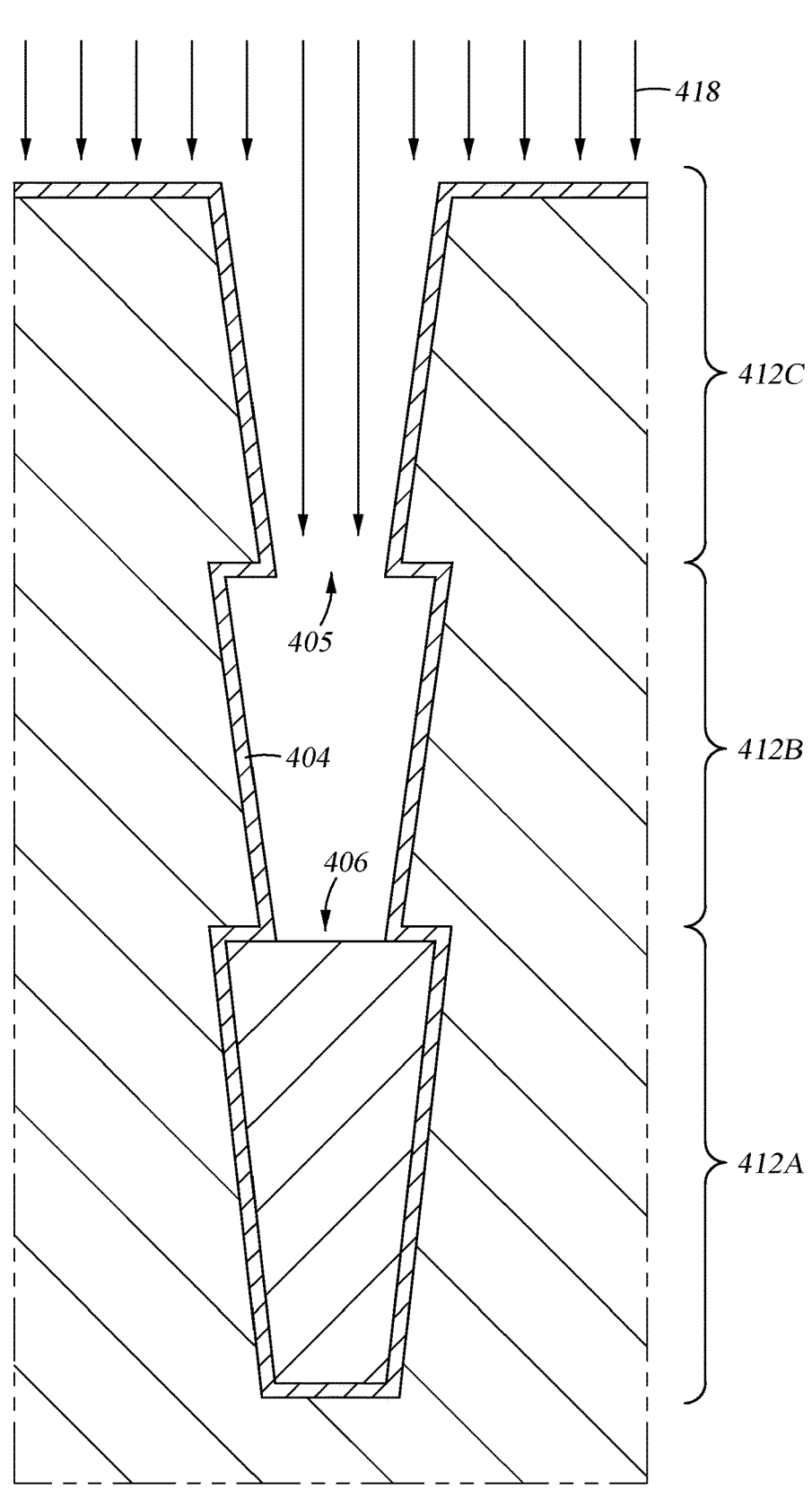
Figure 4E:
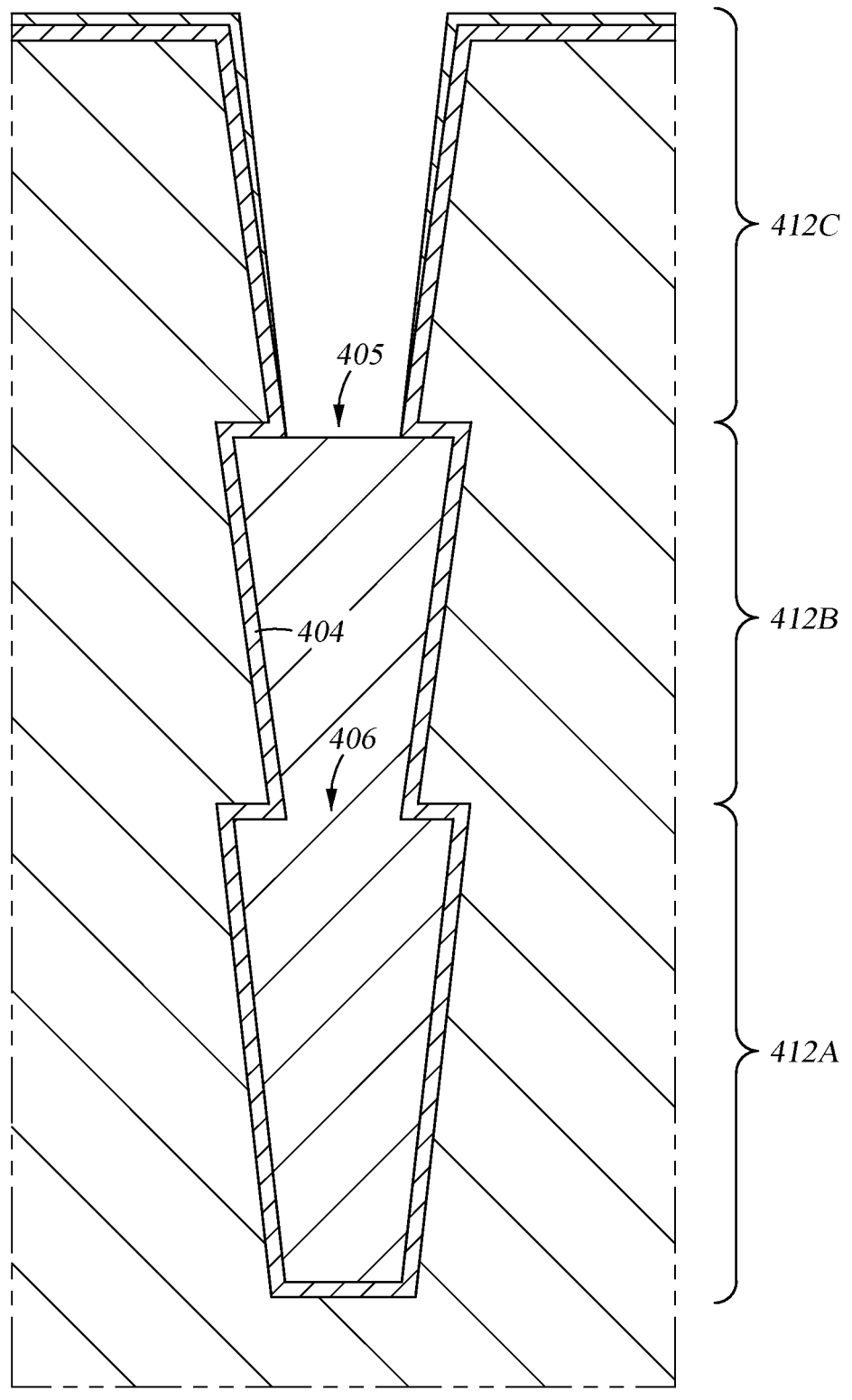
Figure 4F:
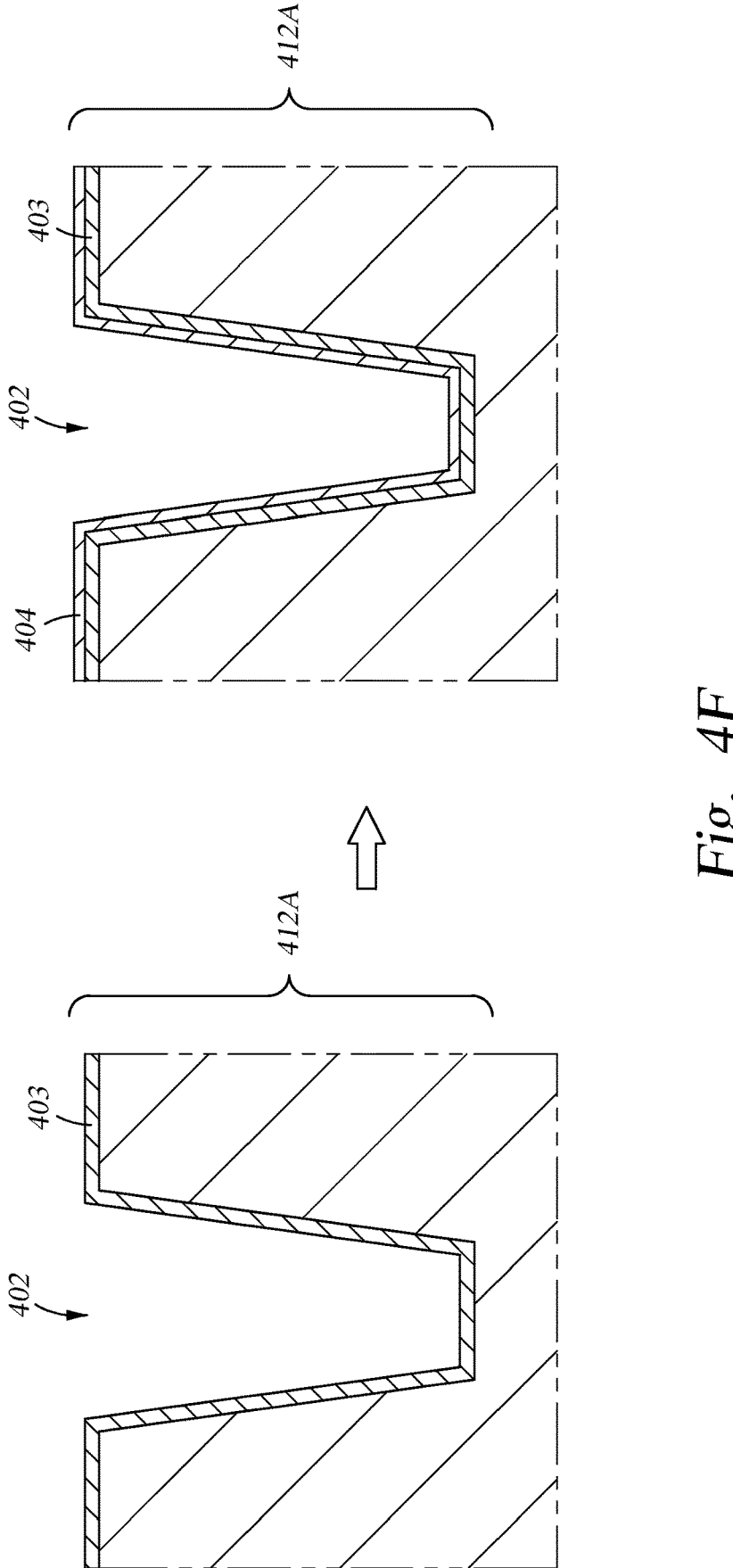
FIGS. 4F-4J are a schematic sectional view of a soak activity on a portion of a substrate as part of a method described herein, according to one embodiment.
Figure 4G:
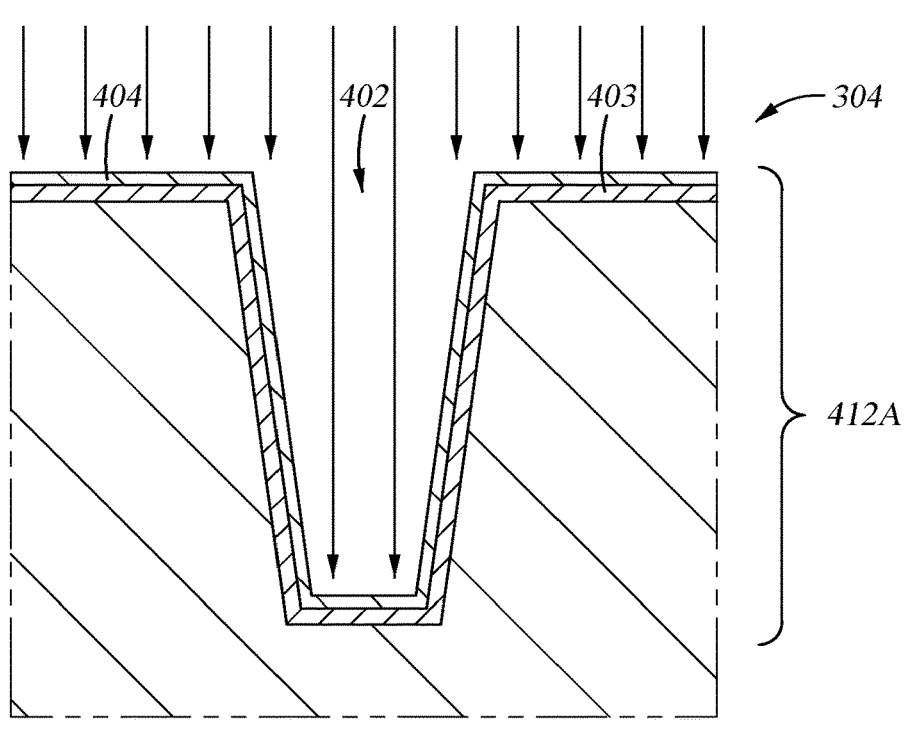
Figure 4H:
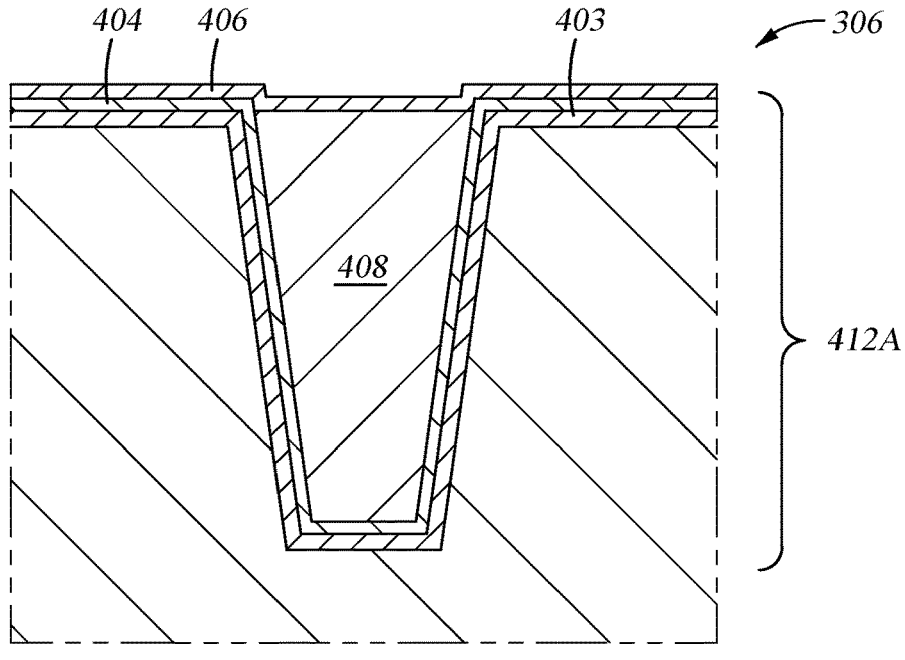
Figure 4I:
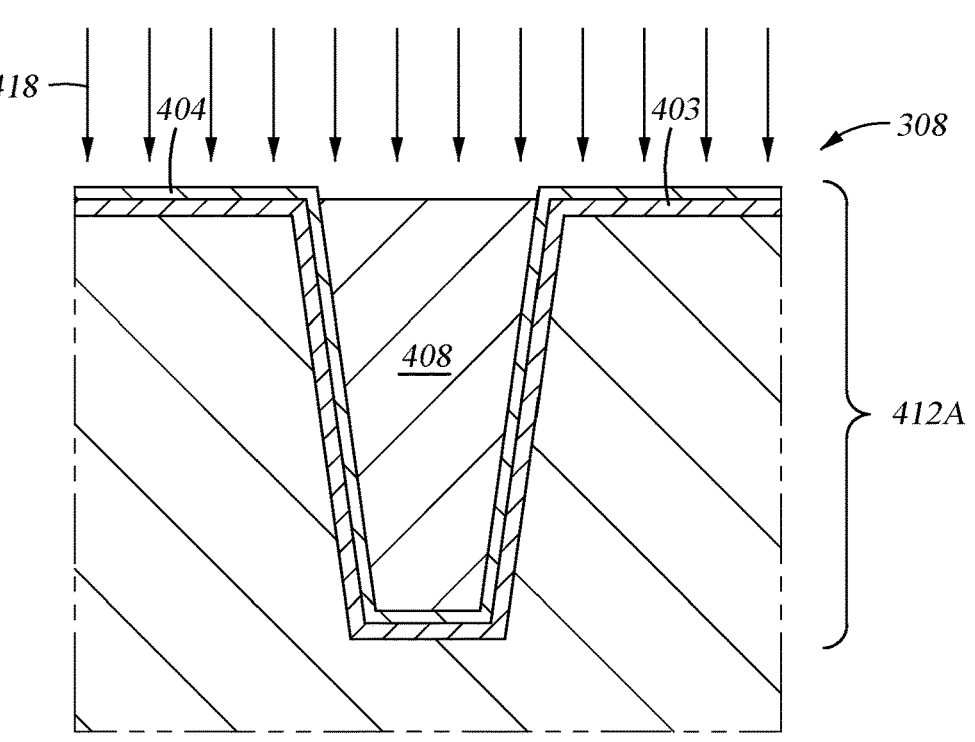
Figure 4J:
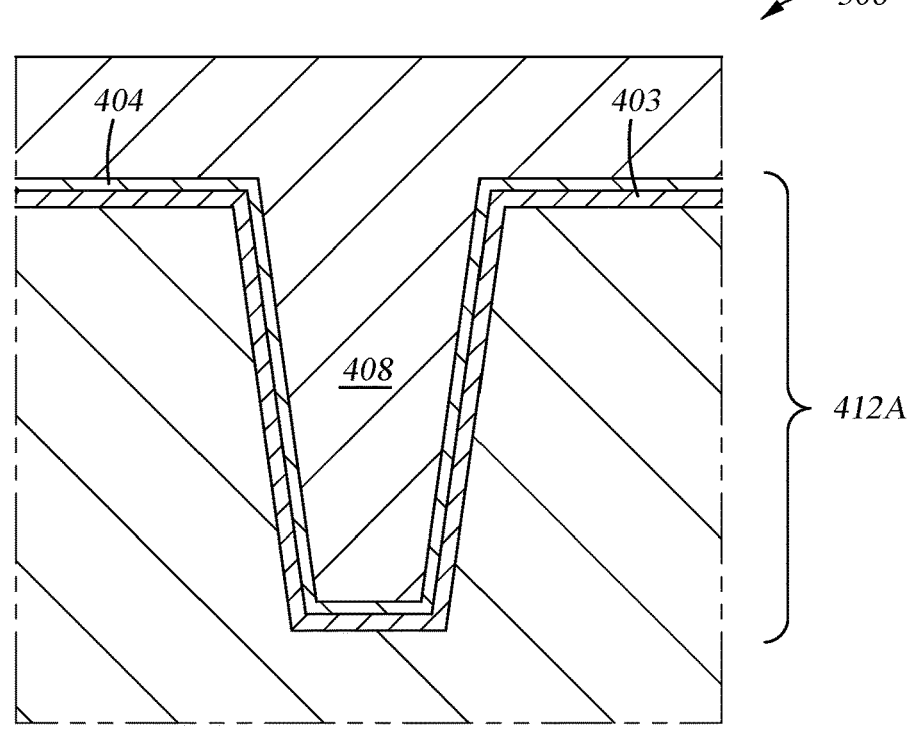

In some embodiments, as shown in process 300A, activity 304, activity 306, and activity 308 (e.g., together C1) can be repeated one or more times, such as once, or twice until the openings are filled. As shown in FIGS. 4C-4E, multiple cycles of activities 304, 306, and 308 are used in a two-tier process. FIGS. 4F-4J show a cycle of activities 304, 306, and 308 in a one-tier process. Further, multiple cycles of activities 304, 306, and 308 may be used in a multi-tier process.

Process 300B—Nitrogen-Containing Gas Treatment+Additional Nucleation

Similar to process 300A, process 300B includes activity 302 (optional activity 306 immediately following activity 302), activity 304, activity 306, and activity 308 (e.g., together C2). After activity 308, one or more cycles (e.g., C2) of activities 302, 304, 306, and 308 may be repeated.

Process 300C—Nitrogen-Containing Gas Treatment+Activated Species Treatment

Similar to process 300A, process 300C includes activity 302 (optional activity 306 immediately following activity 302), activity 304, activity 306, and activity 308. In activity 305, after activity 306, the openings are treated with an activated species of a treatment gas, e.g., the treatment radicals from a remote plasma source. Suitable treatment gases that may be used for the inhibition process include $N_2$, $H_2$, $NH_3$, $NH_4$, $O_2$, $CH_4$, or combinations thereof. In some embodiments, the treatment gas includes nitrogen, such as $N_2$, $H_2$, $NH_3$, $NH_4$, or a combination thereof, and the activated species comprise nitrogen radicals, e.g., atomic nitrogen. In some embodiments, the treatment gas is combined with an inert carrier gas, such as Ar, He, or a combination thereof, to form a treatment gas mixture.

In some embodiments, the non-plasma activated nitrogen-containing gas of activity 304 is alternated with the treatment radicals of activity 305 beginning with the non-plasma activated nitrogen-containing gas or beginning with the treatment radicals. Between each treatment (either nitrogen-containing gas or nitrogen radicals), a tungsten gap fill material 408 is deposited at least partially in one or more of the openings (e.g., activity 306). In process 300C, the non-plasma activated nitrogen-containing gas treatment of activity 304, activity 306, and activity 308 (together C1) is followed by the activated species treatment of activity 305, activity 306, and activity 308 (together C3). Depending on the inhibition profile needed, after C3, another iteration of C1, C2, C3, or combinations thereof can be performed. In some embodiments, one or more C1 cycles maybe completed followed by one or more C3 cycles, which can then both be repeated (e.g., C1+C3 repeated).

The sequence, time of exposure, and ratio of gas flow between the non-plasma activated nitrogen-containing gas (e.g., gas containing $NF_3$, $NH_3$, or $N_2H_4$) and the treatment radicals is determined based on the profile of the openings. For example, for necking points that are deep within the openings, a longer exposure of the non-plasma activated nitrogen-containing gas is used relative to treatment radicals. For necking points having a small width, and for very high aspect ratio features, a longer exposure of the non-plasma activated nitrogen-containing gas is used relative to the process of treating with radicals. A non-plasma activated nitrogen-containing gas duration relative to a treatment with radicals duration can be about 20:1 to about 1:20, such as about 5:1 to about 1:1, or about 1:2 to about 1:6.

Without intending to be bound by theory, it is believed that the activated nitrogen species formed during the treatment with radicals are incorporated into portions of the nucleation layer 404 by adsorption of the activated nitrogen species or by reaction with the metallic tungsten of the nucleation layer 404 to form a tungsten nitride (WN) passivation layer 416. The adsorbed nitrogen or nitrided surface of the tungsten nucleation layer 404 desirably delays (inhibits) further tungsten nucleation and thus subsequent tungsten deposition thereon.

The WN passivation layer 416, while desirably inhibiting tungsten nucleation, may increase tungsten bulk film stress and increase the depassivation time before a subsequent tungsten fill layer may be deposited thereon. Subsequent to forming the WN passivation layer 416 in activity 305, activity 306, or combination of both, a soak of molybdenum halide or oxyhalide such as molybdenum hexafluoride ($MoF_6$) 418 may be used, in activity 308, to etch the WN passivation layer 416 after treatment with a non-plasma activated nitrogen containing gas, nitrogen radicals, or a combination therefrom. The molybdenum halide soak 418 reacts with the WN passivation layer 416 such that the molybdenum halide soak 418 reduces the WN passivation layer 416 and produces an $NF_x$ gas which is evacuated by normal means.

It has been shown that the molybdenum halide soak 418 reduces the bulk film stress. A molybdenum halide soak 418 of greater than 2 seconds can recover the stress penalty cause by the WN passivation layer 416 formation in the film, especially at tungsten bulk thicknesses of greater than 2,500 Å. The molybdenum halide soak 418 of activity 308 also reduces the depassivation time required after exposing the nucleation layer or tungsten fill layer to the non-plasma activated nitrogen-containing gas and nitrogen radicals and allows tungsten growth to resume sooner. Further, the molybdenum halide soak 418 may be done in cycles as desired. For example, the molybdenum halide soak 418 may be done after each tier is treated in activity 305, activity 306, or a combination of both.

It has also been shown that the etch rate of the molybdenum halide soak 418 is proportional to the flow rate of the molybdenum halide soak 418 into the chamber, the temperature of the heaters 229, and pressure of the chamber 202. For example, a flow rate of 80 sccm produces an etch rate of 6 Å per second at 400° C. and 5 Torr. As such, an incubation of 10N10 can be removed after 5 seconds of the molybdenum halide soak 418 at this example etch rate. The flow rate of the molybdenum halide soak 418 may be adjusted to produce a desired soak etch rate at a given heater temperature and chamber pressure.

In some embodiments, exposing the nucleation layer 404 to the treatment radicals includes forming a treatment plasma 282A of a substantially halogen-free treatment gas mixture using the first radical generator 206A and flowing the effluent of the treatment plasma 282A into the processing region 221. In some embodiments, a flow rate of the treatment gas mixture into the first radical generator 206A, and thus the flow rate of the treatment plasma effluent, such as nitrogen gas, into the processing region 221, is about 1 sccm and about 3000 sccm, such as about 1 sccm and about 2500 sccm, such as about 1 sccm and about 2000 sccm, such as about 1 sccm and about 1000 sccm, such as about 1 sccm and about 500 sccm, such as about 1 sccm and about 250 sccm, such as about 1 sccm and about 100 sccm, such as about 1 sccm and about 75 sccm, such as about 1 sccm and about 50 sccm.

In some embodiments, the inhibition treatment process includes exposing the substrate 400 to the treatment radicals for a period of about 2 seconds or more, such as about 2 seconds to about 30 seconds, such as about 5 seconds to about 20 seconds, such as about 10 seconds to about 15 seconds.

In some embodiments, a concentration of the substantially halogen-free treatment gas in the treatment gas mixture is about 0.1 vol. % to about 50 vol. %, such as about 0.2 vol. % to about 40 vol. %, about 0.2 vol. % to about 30 vol. %, about 0.2 vol. % and about 20 vol. %, or, for example, such as about 0.2 vol. % and about 10 vol. %, such as about 0.2 vol. % and about 5 vol. %.

In other embodiments, the treatment radicals may be formed using a remote plasma (not shown) which is ignited and maintained in a portion of the processing volume 215 that is separated from the processing region 221 by the showerhead 218, such as between the showerhead 218 and the lid plate 216. In those embodiments, the activated treatment gas may be flowed through an ion filter to remove substantially all ions therefrom before the treatment radicals reach the processing region 221 and the surface of the substrate 400. In some embodiments, the showerhead 218 may be used as the ion filter. In other embodiments, a plasma used to form the treatment radicals is an in-situ plasma formed in the processing region 221 between the showerhead 218 and the substrate 400. In some embodiments, e.g., when using an in-situ treatment plasma, the substrate 400 may be biased to control the directionality of and accelerate ions formed from the treatment gas, e.g., charged treatment radicals, towards the substrate surface.

In some embodiments, the inhibition treatment process includes maintaining the processing volume 215 at a pressure of less than about 100 Torr while flowing the activated treatment gas thereinto. For example, during the inhibition treatment process, the processing volume 215 may be maintained at a pressure of about 20 Torr or less, such as about 0.5 Torr and about 10 Torr, such as about 1 Torr and about 5 Torr.

Process 300D—Nitrogen-Containing Gas Treatment+Additional Nucleation+Activated Species Treatment Process 300D includes activity 302 (optional activity 306 immediately following activity 302), activity 304, activity 306, and activity 308 (together C2). After activity 308, an additional nucleation activity 302 is performed, followed by an activated species treatment of activity 305, followed by activity 308, then followed by activity 306 (together C4). Additional iterations of C1, C2, C3, C4, and combinations thereof are also contemplated thereafter. In some embodiments, one or more C2 cycles maybe completed followed by one or more C4 cycles, which can then both be repeated (e.g., C2+C4 repeated).

Process 300E—Activated Species Treatment+Nitrogen-Containing Gas Treatment

Process 300E includes activity 302 (optional activity 306 immediately following activity 302), activity 305, activity 306, and activity 308 (together C4). After activity 308, a non-plasma activated nitrogen-containing gas treatment of activity 304 is performed, followed by CVD tungsten gapfill for activity 306, followed by activity 308 (together C1). Additional iterations of C1, C2, C3, C4, and combinations thereof are also contemplated thereafter. In some embodiments, one or more C4 cycles maybe completed followed by one or more C1 cycles, which can then both be repeated (e.g., C4+C1 repeated).

Process 300F—Activated Species Treatment+Nitrogen-Containing Gas Treatment

Process 300F includes activity 302 (optional activity 306 immediately following activity 302), activity 305, activity 306, and activity 308 (together C4). After activity 308, an additional nucleation activity 302 is performed, followed by a non-plasma activated nitrogen-containing gas treatment activity 304, followed by CVD tungsten gapfill for activity 306, then followed by a molybdenum halide soak activity 308 (together C2). Additional iterations of C1, C2, C3, C4, and combinations thereof are also contemplated thereafter. In some embodiments, one or more C4 cycles maybe completed followed by one or more C2 cycles, which can then both be repeated (e.g., C4+C2 repeated).

Although not depicted in the Figures, in some embodiments, activities 304 and 305 occur immediately after one another without an intervening activity, such as activity 306 or activity 308.

In a typical semiconductor manufacturing scheme, a chemical mechanical polishing (CMP) process may be used to remove an overburden of tungsten material (and the barrier layer disposed there below) from the field surface of the substrate following depositing the tungsten gapfill material 408 into the opening 405.

While the foregoing is directed to embodiments of the present disclosure, other and further embodiments of the disclosure may be devised without departing from the basic scope thereof, and the scope thereof is determined by the claims that follow.

What is claimed is:

1. A method of forming a structure on a substrate, comprising:

exposing at least one opening formed in a multi-tier portion of the substrate to a tungsten-containing gas at a precursor gas flow rate;

exposing the at least one opening of the substrate to a reducing agent at a reducing agent flow rate, wherein the tungsten-containing gas and the reducing agent are alternated cyclically to form a nucleation layer within the at least one opening of the substrate;

exposing the at least one opening of the substrate to a nitrogen-containing gas to inhibit growth of the nucleation layer at narrow portions within the at least one opening, exposing the at least one opening of the substrate to the tungsten-containing gas to form a fill layer over the nucleation layer within the at least one opening; and exposing the at least one opening to a molybdenum-containing gas to remove a desired amount of a tungsten nitride passivation layer from the fill layer.

2. The method of claim 1, wherein the molybdenum-containing gas is selected from the group consisting of molybdenum halides, molybdenum oxyhalides, and combinations thereof.

3. The method of claim 2, wherein exposing the at least one opening to a molybdenum-containing gas to remove a desired amount of a tungsten nitride passivation layer from the fill layer comprises flowing the molybdenum-containing gas at a first flow rate to produce a first etch rate.

4. The method of claim 3, wherein the first etch rate is proportional to the first flow rate of the molybdenum-containing gas.

5. The method of claim 4, wherein exposing the at least one opening of the substrate to a molybdenum-containing gas includes flowing the molybdenum-containing gas for a period ranging from about 1 second to about 30 seconds.

6. The method of claim 1, further comprising exposing the at least one opening of the substrate to a nitrogen-containing plasma to inhibit growth of the fill layer along the at least one opening.

7. The method of claim 6, further comprising determining sequence, time of exposure, and ratio of gas flow between the nitrogen-containing gas and the nitrogen-containing plasma based on a profile of the at least one opening.

8. A method of forming a structure on a substrate, comprising:

exposing at least one opening formed within the substrate to a tungsten-containing precursor gas at a precursor gas flow rate, wherein the at least one opening comprises a lower portion and an upper portion, wherein the upper portion comprises a width smaller than a width of the lower portion;

exposing the at least one opening of the substrate to a reducing agent at a reducing agent flow rate, wherein the tungsten-containing precursor gas and the reducing agent are alternated cyclically to form a nucleation layer within the at least one opening of the substrate;

exposing the at least one opening of the substrate to the tungsten-containing precursor gas to form a fill layer over the nucleation layer within the at least one opening;

exposing the at least one opening of the substrate to a nitrogen-containing gas;

exposing the at least one opening of the substrate to a molybdenum-containing gas to remove a tungsten nitride passivation layer from the fill layer on the at least one opening; and exposing the at least one opening of the substrate to the tungsten-containing precursor gas to form the fill layer within the at least one opening.

9. The method of claim 8, wherein the molybdenum-containing gas is selected from the group consisting of molybdenum halides, molybdenum oxyhalides, and combinations thereof.

10. The method of claim 8, wherein the at least one opening further comprises a middle portion between the upper portion and the lower portion, wherein the middle portion comprises a width smaller than the width of the upper portion and the width of the lower portion.

11. The method of claim 10, further comprising exposing the at least one opening of the substrate to the nitrogen-containing gas or a nitrogen-containing plasma to inhibit growth of the fill layer along the at least one opening.

12. The method of claim 10, wherein the substrate comprises an upper tier layer and a lower tier layer interfacing the upper tier layer at an interface, wherein a width of the at least one opening within the upper tier layer at the interface is narrower than a width of the at least one opening within the lower tier layer at the interface.

13. The method of claim 10, wherein exposing the at least one opening of the substrate to a molybdenum-containing gas includes flowing the molybdenum-containing gas for a period ranging from about 1 second to about 30 seconds.

14. The method of claim 10, wherein exposing the at least one opening of the substrate to a nitrogen-containing gas includes flowing the nitrogen-containing gas at a rate of about 0.5 sccm to about 500 sccm.

15. The method of claim 10, wherein the nitrogen-containing gas is selected from the group consisting of $NF_3$, $NH_3$, $N_2H_4$, and combinations thereof.

16. A method of forming a structure on a substrate, comprising:

forming a tungsten nucleation layer within at least one opening formed in a multi-tier portion of the substrate;

exposing the tungsten nucleation layer to a nitrogen-containing plasma to inhibit growth of the tungsten nucleation layer at narrow portions within the at least one opening;

exposing the at least one opening to a tungsten-containing precursor gas to form a fill layer over the nucleation layer within the at least one opening;

exposing the at least one opening of the substrate to a nitrogen-containing gas to inhibit growth of the fill layer along the at least one opening; and exposing the at least one opening to a molybdenum-containing gas to remove a tungsten nitride passivation layer from the fill layer on the at least one opening.

17. The method of claim 16, further comprising before exposing the at least one opening of the substrate to the nitrogen-containing gas, forming a second nucleation layer over the fill layer.

18. The method of claim 17, further comprising after exposing the at least one opening of the substrate to the nitrogen-containing gas, exposing the at least one opening to a molybdenum-containing gas to remove a tungsten nitride passivation layer from the tungsten nucleation layer on the at least one opening and then forming a second fill layer within the at least one opening.

19. The method of claim 18, further comprising exposing the second fill layer within the at least one opening to the nitrogen-containing gas or the nitrogen-containing plasma to inhibit growth of the second fill layer.

20. The method of claim 19, further comprising exposing the at least one opening to a molybdenum-containing gas to remove a tungsten nitride passivation layer from the second fill layer on the at least one opening then forming a third fill layer within the at least one opening.

*  *  *  *  *